United States Patent [19]

Purdy et al.

[11] Patent Number: 4,660,125
[45] Date of Patent: Apr. 21, 1987

[54] RIBBON CABLE ASSEMBLY

[75] Inventors: Michael L. Purdy, Stittsville; James D. Pue-Gilchrist, Richmond, both of Canada

[73] Assignee: Northern Telecom Limited, Montreal, Canada

[21] Appl. No.: 849,648

[22] Filed: Apr. 9, 1986

[30] Foreign Application Priority Data

Feb. 24, 1986 [CA] Canada ................................. 502554

[51] Int. Cl.$^4$ .............................................. H02B 1/02
[52] U.S. Cl. ..................................... 361/391; 361/428
[58] Field of Search ....... 339/198 R, 198 G, 198 GA, 339/198 S, 198 P, 176 MF; 361/338, 428, 391; 312/319, 330, 320

[56] References Cited

U.S. PATENT DOCUMENTS 3,448,346 6/1969 Webb .................................. 361/428
3,566,004 2/1971 Creedon .............................. 361/428

OTHER PUBLICATIONS

IBM Technical Disclosure Bulletin, vol. 21, #5 Oct. 1978.

Primary Examiner—Kenneth J. Dorner
Assistant Examiner—Joseph Falk
Attorney, Agent, or Firm—John E. Mowle

[57] ABSTRACT

A ribbon cable assembly for interconnection to an electronic equipment pull-out drawer which is arranged so as to occupy a minimum of depth within the drawer while effectively preventing kinking or tangling of the cables as the drawer is opened and closed. This is achieved by folding each of the cables back on themselves so that they individually connect to the back of the drawer at different elevations at connections which are in vertical alignment with one another. In addition the cables overlie each other so that their flat surfaces are orthogonal to the direction of movement of the pull-out drawer.

2 Claims, 2 Drawing Figures

RIBBON CABLE ASSEMBLY

This invention relates to a ribbon cable assembly and more particularly to an interconnection arrangement of a plurality of ribbon cables in an electronic equipment pull-out drawer which occupies a minimum of depth within the drawer while effectively preventing kinking or tangling of the cables.

BACKGROUND OF THE INVENTION

Electronic equipment drawers are commonly utilized to house electrical components particularly high density printed circuit boards on which there are mounted electrical modules and components. Because of the high density, large multi-pin connectors must be utilized to interconnect the electronic components in the drawer and the surrounding cabinet. One common arrangement is to provide mating connectors on the back of both the drawer and the cabinet which mate together when the drawer is fully pushed in. However, in some applications it is necessary that the equipment remain connected whenever the drawer is extended from the cabinet for servicing. With such an arrangement, a considerable amount of slack must be provided in the cable in order that the equipment remains connected when the drawer is extended.

In many high density systems, it is desirable to use a plurality of ribbon cables to provide these interconnections. While such cables are very flexible for bends in one direction they are virtually inflexible for bends in the other direction. As a result they can become easily entangled with each other or with portions of the drawer as it is opened and closed. In addition these cables must be disposed so that the depth of space in the cabinet taken by them and their mating connectors, is minimized.

STATEMENT OF THE INVENTION

It has been found that by providing a ribbon cable assembly with a particular structural arrangement, these problems can be effectively overcome. Thus, in accordance with the present invention there is provided a ribbon cable assembly for electrically interconnecting a cabinet and a pull-out drawer disposed therein. The cabinet has a front and a back with an opening in the front. The pull-out drawer is slideably mounted in the cabinet through the opening so that the drawer can be pulled open or pushed closed. The drawer in turn has a front facing the opening in the cabinet and a back which is adjacent the back of the cabinet when the drawer is closed.

The ribbon cable assembly is characterized by a plurality of ribbon cables and a clamping means for fixing them to the upper back of the cabinet substantially in line with the pull-out drawer. The cables overly one another with their flat surfaces orthogonal to the direction of movement of the pull-out drawer. Connectors which are connected to one end of each of the ribbon cables, connect each ribbon cable to the back of the drawer in vertical alignment with respect to each other. Each of the ribbon cables extends substantially coextensively vertically downwards from the clamping means on the upper back of the cabinet to near bottom of the cabinet and then substantially vertically upwards and over a retaining bar on the back of the drawer, then substantially vertically downwards contiguous the back of the drawer where each has a right-angled transition to the respective connectors. As a result, the drawer can be pulled in or out without kinking or tangling of the ribbon cables while at the same time they and their connectors occupy a minimum of depth in the cabinet.

In a particular embodiment, the longitudinal axes of each of the connectors are vertically aligned with each other so that each of the ribbon cables connected thereto projects horizontally from a side of the drawer which is parallel to its direction of movement as the drawer is opened and closed. In addition, each of the ribbon cables is folded sharply back on itself to provide a right-angled transition from the substantially vertically downwards extension contiguous the upper back of the cabinet from the retaining bar to the horizontal projection.

DESCRIPTION OF THE PREFERRED EMBODIMENT

Figure 1:
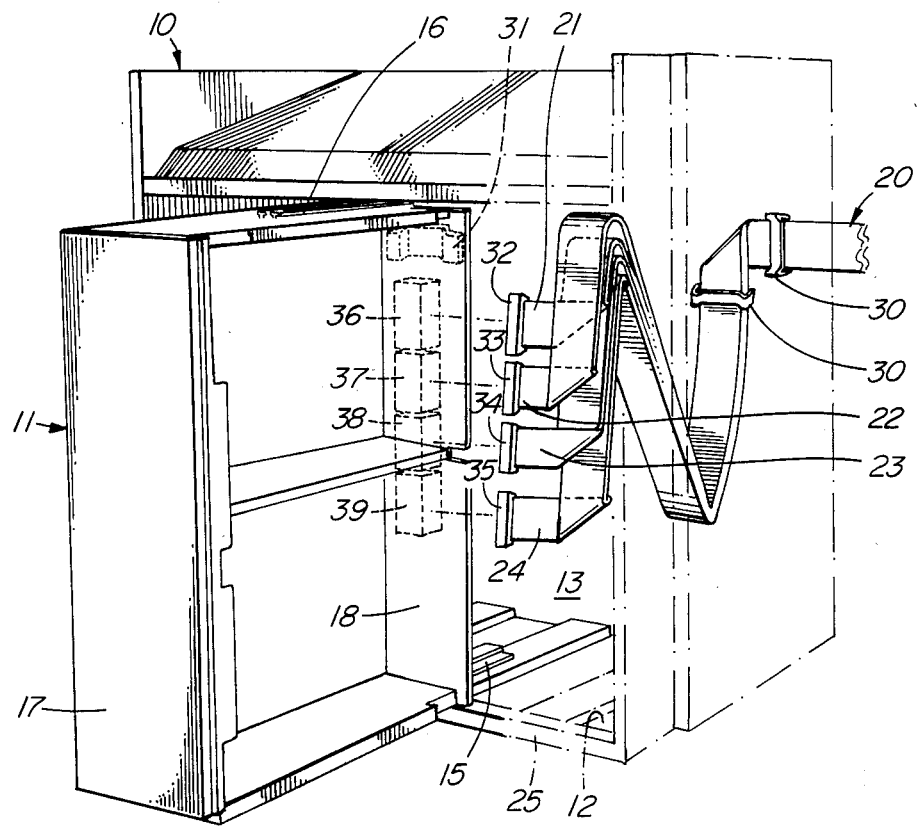
FIG. 1 is an exploded perspective view of an electronic equipment cabinet and drawer assembly interconnected by a ribbon cable assembly in accordance with the present invention.
Figure 2:
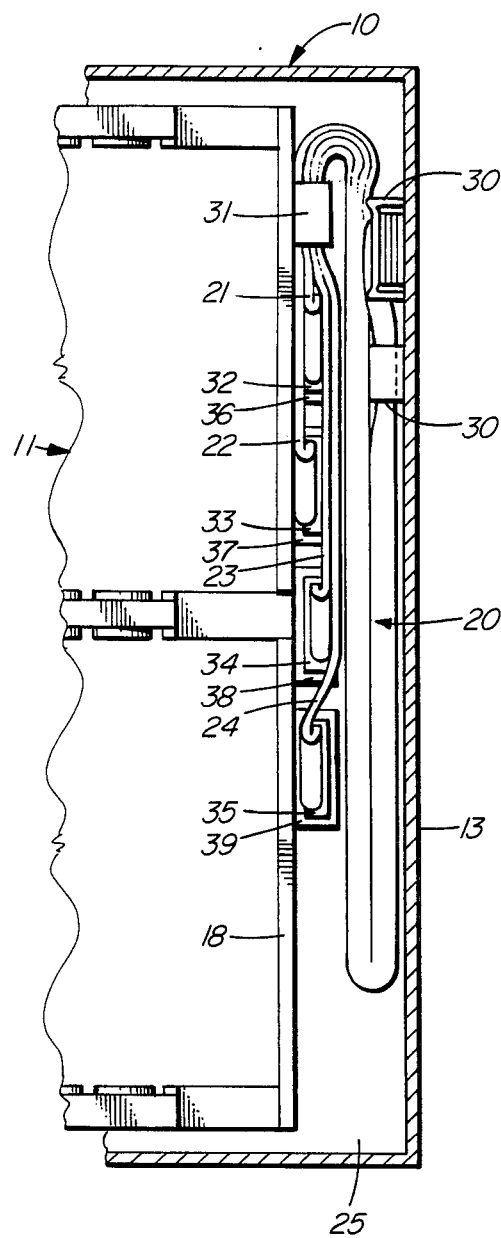
FIG. 2 is a side elevational view of the ribbon cable assembly shown in FIG. 1, installed in the cabinet and connected to the drawer which is shown in its closed position.

Referring to FIGS. 1 and 2, there is shown an electronic equipment cabinet 10 which will house a plurality of pull-out drawers one of which 11, is illustrated in these drawings. The cabinet 10 has an open front 12 and a closed back 13 with the pull-out drawer slidably mounted on telescoping rails 15 and 16 through the front 12 so that it can be moved from an open position as shown in FIG. 1 to a closed position. When in the closed position the front 17 and back 18 of the drawer 11 are substantially adjacent the front 12 and back 13 of the cabinet respectively.

The ribbon cable assembly, generally 20, comprises four ribbon cables 21, 22, 23, and 24. The cables 21 to 24 overlie one another with their flat surfaces substantially orthogonal to the direction of movement of the pull-out drawer 11. The cable assembly 20 is fixed to the back 13 of the cabinet 10 by two clamps 30. The cable assembly 20 which initially runs horizontally along the back of the cabinet 13 is folded at right angles so that each of the ribbon cables 21, 22, 23, and 24, can extend substantially coextensively downwards from the clamps 30 to the near bottom 25 of the cabinet 10. The cables then run substantially coextensively upwards over a retaining bar 31 located on the back of the pull-out drawer 11. The ribbon cables 21, 22, 23, and 24 then extend contiguously down the back 18 of the drawer 11 where they are alternately folded forward and back on themselves to form right-angle transitions to horizontal projections at non-overlapping elevations adjacent the back 18 of the drawer 11. This forward and back folding of the cables also helps to ensure the minimum depth is occupied by the cable assembly 20 when the drawer 11 is in a closed position as particularly shown in FIG. 2.

The ribbon cables 21, 22, 23, and 24, terminate in mating connectors 32, 33, 34, and 35 respectively, which can be plugged into mating sockets 36, 37, 38, and 39 in the back of the drawer 18. The sockets 36, 37, 38, and 39 are mounted vertically lengthwise down the back 18 of the drawer 11. With this orientation, they occupy the minimum depth in the cabinet 10 when the drawer 11 is closed.

Because the cables 21, 22, 23, 24 of the assembly 20 are disposed over the bar 31 thence downwards towards the bottom 25 of the cabinet 10 and upwards to the clamps 30 at the back of the cabinet 10, the likelihood of tangling or kinking of the ribbon cable assembly 20 as the drawer 11 is pushed in or pulled out, is substantially eliminated. This is achieved while at the same time the assembly 20 occupies a minimum amount of depth within the cabinet 10 so as to ensure maximum utilization of the space available for electronic equipment to be housed in the drawer 11.

Also with this cable arrangement, no access is required to the back of the cabinet 10 either while the drawer 11 is being opened or closed or while the cable connectors 32, 33, 34, and 35, are being removed from the drawer 11. This permits back to back installation of the cabinets thereby providing optimum utilization of floor space.

Where required, the cable assembly 20 from the back of the cabinet 10 can be brought forward along one side of the cabinet 10 so that external connections can be readily made during installation.

What is claimed is:

1. A ribbon cable assembly for electrically interconnecting a cabinet and a pull-out drawer disposed therein in which:

the cabinet and the pull-out drawer each has a front, a back, and a bottom, and the pull-out drawer is slideably mounted through the front of the cabinet for movement between an open and a closed position, so that the front and the back of the drawer are adjacent respectively the front and the back of the cabinet when the drawer is in the closed position;

the ribbon cable assembly is characterized by:

a plurality of ribbon cables for electrically interconnecting the cabinet and the pull-out drawer, each cable having broad opposed surfaces and narrow edges extending along its length;

a retaining bar disposed on the upper back of the drawer for supporting the plurality of ribbon cables thereon, and a clamping means disposed on the upper back of the cabinet for fixing the plurality of ribbon cables thereto, the cables overlying one another with their broad opposed surfaces substanially orthogonal to the direction of movement of the pull-out drawer;

each of the ribbon cables extending substanially coextensively downwards from the clamping means to a fold in each of the ribbon cables near the bottom of the cabinet, then upwards from each fold and over the retaining bar to a further fold in the cables contiguous said bar, and then downwards contiguous the back of the drawer, so both the folds and further folds unfold and refold when the drawer is opened and closed respectively;

each of the ribbon cables as it extends contiguously down the back of the drawer, is folded sharply over on itself to form a right-angled transition to horizontal projecting portions at non-overlapping elevations adjacent the back of the drawer; and vertically stacked connecting means for connecting the horizontal projecting portions of the ribbon cables to the back of the drawer, so as to minimize their depth of space occupied in the cabinet, while allowing withdrawl and insertion of the drawer without kinking or tangling of the ribbon cables.

2. A ribbon cable assembly as defined in claim 1 in which the ribbon cables are alternately folded forwards and backwards down the back of the drawer to form the horizontal projecting portions, so as to minimize the thickness of the overlying layers.

* * * * *